United States Patent [19]

Tsui et al.

[11] Patent Number: 4,547,727
[45] Date of Patent: Oct. 15, 1985

[54] SIMULTANEOUS SIGNAL DETECTION FOR IFM RECEIVERS BY TRANSIENT DETECTION

[75] Inventors: James B. Y. Tsui, Centerville; Rudy L. Shaw, Huber Heights, both of Ohio

[73] Assignee: The United States of America as represented by the Secretary of the Air Force, Washington, D.C.

[21] Appl. No.: 512,064

[22] Filed: Jul. 8, 1983

[51] Int. Cl.$^4$ ...................... G01R 23/14; G01R 23/16
[52] U.S. Cl. .............. 324/79 D; 324/77 R; 343/55 A
[58] Field of Search .......... 324/79 D, 77 H; 455/226; 343/18 E, 55 A; 307/525, 527, 528

[56] References Cited

U.S. PATENT DOCUMENTS

| | | | |
|---|---|---|---|
| 3,939,411 | 2/1976 | James | 324/77 H |
| 4,188,628 | 2/1980 | Langeraar | 343/55 A |
| 4,336,541 | 6/1982 | Tsui | 343/18 E |
| 4,426,648 | 1/1984 | Tsui | 343/18 E |

Primary Examiner—Gerard R. Strecker
Assistant Examiner—R. Raevis
Attorney, Agent, or Firm—Donald J. Singer; Bernard E. Franz

[57] ABSTRACT

The instantaneous frequency measurement (IFM) receiver is highly susceptible to erroneously reporting frequency if two or more signals are overlapped in time. This problem is extremely important when the receiver is presented with synchronized signals. A method is presented to detect simultaneous signals which overlap in the critical frequency encode strobe.

In essence, during the pulse overlap condition, a transient will occur on the video output lines of the receiver. These lines are monitored during the transient period and compared with predetermined values which are obtained from the single signal condition. If a transient is detected, a simultaneous signal detect flag is raised and this flag is sent to an associated processor. In this special design, the receiver will measure the frequency again at approximately 200 ns from the first measurement. The transient detection is also performed on the second measurement.

5 Claims, 11 Drawing Figures

IF $A(\omega) > B(\omega)$ SINGLE SIGNAL
IF $A(\omega) < B(\omega)$ SIMULTANEOUS SIGNAL
DETECTION FLAGS

CAUSED BY SIMULTANEOUS SIGNALS

IF A(ω)>B(ω) SINGLE SIGNAL
IF A(ω)<B(ω) SIMULTANEOUS SIGNAL
DETECTION FLAGS

SIMULTANEOUS SIGNAL DETECTION FOR IFM RECEIVERS BY TRANSIENT DETECTION

RIGHTS OF THE GOVERNMENT

The invention described herein may be manufactured and used by or for the Government of the United States for all governmental purposes without the payment of any royalty.

BACKGROUND OF THE INVENTION

This invention relates to instantaneous frequency measurement (IFM) receivers, having the capability of detecting the presence of simultaneously occurring signals differing in frequency.

The conventional Instantaneous Frequency Measurement (IFM) receiver is a radio frequency (RF) receiver used primarily in electronic warfare (EW). It's basic function is to measure the frequency of pulsed signals radiated from hostile radar. Although some IFM receivers have the capability of measuring pulse amplitude, pulse width, and time of arrival, this invention is only concerned with the frequency measurement capability of the receiver.

Generally, it may be said that IFM receivers measure the frequencies of incoming RF signals utilizing interferometric techniques by detecting the phase shift magnitudes produced in multiple, calibrated delay lines. For instance, the received RF signal is divided and simultaneously introduced into a non-delayed path and a delay line of known length. Since the phase differences between the delayed and non-delayed receiver paths are functions of the input signal frequency, conversion of the phase difference signals to video provides signals whose amplitudes are related to the phase delay. These video signals typically take the form $\sin\omega\tau$ or $\cos\omega\tau$, where $\omega$ is the angular frequency of the processed input signal. The $\sin\omega\tau/\cos\omega\tau$ signals are delivered to the encoding network which makes amplitude comparisons of the signals, determines the numerical value of $\omega$, and generates the digital frequency descriptive word.

Characteristically, to achieve wide, unambiguous bandwidths and fine frequency resolution, it is necessary for the IFM receiver to have multiple delay lines, correlators and comparators to accomplish the frequency measurement. The delay between the leading edge of the RF pulse and the strobe to encode the $\sin\omega\tau/\cos\omega\tau$ video signals can be no shorter than the length of time it takes for the signal to transition the longest delay line, correlator and encoding network. As a general rule, the strobe to encode a sample occurs less than 120 nsec after the leading edge of the first RF pulse.

An IFM receiver has many attractive features necessary for EW applications, such as small size, light weight, wide instantaneous bandwidth, and fine frequency resolution. Unfortunately, a conventional IFM receiver has inherent signal detection problems when presented with time coincident received pulse signals. It is fairly common for many modern radars to simultaneously emit pulse signals of two or more frequencies, resulting in their arriving simultaneously at an intercept receiver. If the time difference between the leading edges of the two RF incoming pulses is greater than the time needed to complete the strobe encoding process (i.e., 120 nsec), the receiver will detect and frequency encode the leading RF signal without any problem. However, if the two RF pulses overlap with a time between leading edges less than the time to complete an encode strobe, one of three conditions will result. Either the first signal will be correctly encoded, or the second signal will be correctly encoded, or the receiver will encode ambiguous data (erroneous frequency data). Consequently, an IFM receiver can convey ambiguous frequency data when near-simultaneous RF pulses are received.

The probability of obtaining erroneous frequency data from an IFM receiver is also influenced by the relative power difference between the incoming RF pulses.

Recognizing that even a small percent of erroneous frequency data can cause the signal processor following the IFM receiver to measurably slow or completely malfunction, it is essential that the existence of simultaneous or near-simultaneous RF pulses of different frequencies be detected. Once the concurrence is detected, the encoded frequency measurement can be disregarded or flagged for special handling.

The best known prior art is that contained by U.S. Pat. No. 3,939,411 to patentee James which discloses an IFM system which includes a technique to actually measure pulse signals emitted simultaneously. This technique utilizes a dispersive delay line which is not utilized in the present invention. A potential disadvantage exists with this technique when a series of input pulses is received which though separated at the input of the dispersive delay line, actually becomes simultaneous at the output. The James patent also does not flag the simultaneous pulse data as having a probability of erroneous data.

U.S. Pat. No. 4,336,541 James Tsui et al for a Simultaneous Signal Detection Circuit for an Instantaneous Frequency Measurement Receiver, covers a circuit which will detect simultaneous signals when the leading edges of the two signals are separated more than 20 nsec. When the leading edges of the two signals are time coincident or less than 20 nsec, the detection circuit does not sense the simultaneous signals.

SUMMARY OF THE INVENTION

An object of the invention is to provide an IFM receiver with improved capability to detect a simultaneous signal condition, particularly if the signals have large amplitude separations. Another object is to provide a capability of improved efficiency in the processing of an IFM receiver, with improved probability for measuring the correct frequency under simultaneous signal conditions.

In essence, during the pulse overlap condition, a transient will occur on the video output lines of the receiver. According to the invention, these lines are monitored during the transient period and compared with predetermined values which are obtained from the single signal condition. If a transient is detected, a simultaneous signal detect flag is raised and this flag is sent to an associated processor.

A principal feature relates to the use of read only memories (ROM's) for performing the transient detector process with digital signals. One read only memory is used to determine the amplitude of the incoming signal condition by a table look up of the square root of the sum of the squares of the sine and cosine terms. Another read only memory stores the predetermined values of expected amplitude at different frequencies, the stored amplitude value being slightly below the expected value. If comparison of the contents of the two memories shows that the received amplitude is below the stored value, this is the indication of a transient, for setting the flag.

Another feature relates to a design to instruct the receiver to measure the frequency again, approximately 200 ns after the first measurement. The transient detection is also performed on the second measurement.

DETAILED DESCRIPTION

Introduction

An IFM receiver is a radio frequency (RF) receiver used in electronic warfare (EW) applications. It's basic function is to measure the frequency of pulsed RF signals. The IFM receiver has many attributes necessary for EW applications, such as the small size, wide instantaneous bandwidth and fine frequency resolution. However, the receiver has a inherent signal detection problem when presented with time coincident signals. If a signal arrives prior to successfully encoding the frequency of an initial signal, there is a high probability of not correctly encoding either signal. It is the intent of this invention to detect simultaneous signals while the receiver is measuring the input frequency. The simultaneous signal detection circuit will report simultaneous signals to an associated receiver processor and also make another measurement on the frequeny approximately 200 ns later.

IFM Receiver Problem Area

The IFM receiver measures the frequency of incoming RF signals by interferometer techniques. This technique consists of dividing the input RF signal and transmitting the signal down a non-delayed path and a delay line of known length ($\tau$). The phase difference of the two paths, a function of input frequency, is converted into video signals. These video signals are typically termed the $A(\omega)\sin\omega\tau/A(\omega)\cos\omega\tau$ and are delivered to the encoding network which generates the frequency information in digital format. The encoding network will strobe the frequency information into registers in less than 120 ns from the leading edge of the video output signals.

The IFM receiver can detect only one RF signal at a time. If two RF signals are overlapping in time, with the time between leading edges larger than the time to the frequency encode strobe, the receiver will detect and frequency encode only the leading signal. When two RF pulses are overlapping with time between leading edges less than the time to the frequency encode strobe, one of three conditions will result. Either the first signal will be correctly encoded, the second signal will be correctly encoded, or the receiver will encode erroneous frequency.

If a first input signal is followed by a strong signal delayed by 50–80 ns, the IFM receiver will generate many erroneous frequency data. However, under this condition, if a second frequency measurement is made at approximately 50–200 ns after the first measurement, the chance of obtaining the correct frequency of the strong signal is very high provided the pulse width is long enough for this second measurement.

Other Simultaneous Signal Detection Techniques

Figure 1:
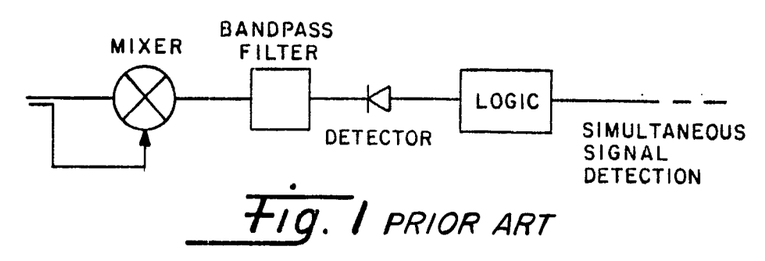
FIG. 1 is a block diagram of a prior art simultaneous signal detector using harmonic mixing.

A simultaneous signal detection technique presently being used in some systems is shown in FIG. 1. The circuit consists of a power divider, mixer, bandpass filter and detector. If a single RF signal is introduced at the input of the receiver, the result after mixing, will be primarily a d-c component, harmonic frequencies of the input signal and its feed through component. If the bandpass filter has an upper frequency limit lower than the minimum cut-off frequency of the receiver, there will be no signal at the detector. When two simultaneous RF signals are introduced, the difference frequency between the two will be passed by the filter and detected. The lower frequency limit of the bandpass filter is governed by how close in frequency the simultaneous signals are to be detected. This detection scheme is basically limited to detecting simultaneous signals which are 0 to 6dB apart. This approach is best used for simultaneous signals with time coincident leading edges.

Figure 2:
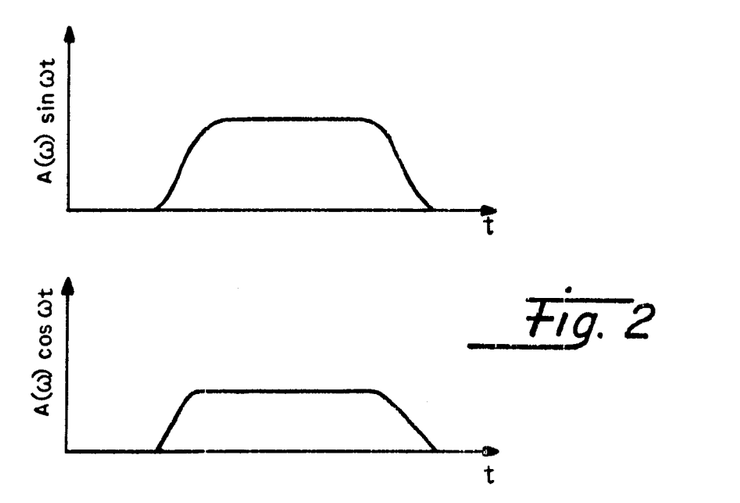
FIG. 2 comprises graphs showing the video output signals with a single signal.
Figure 3:
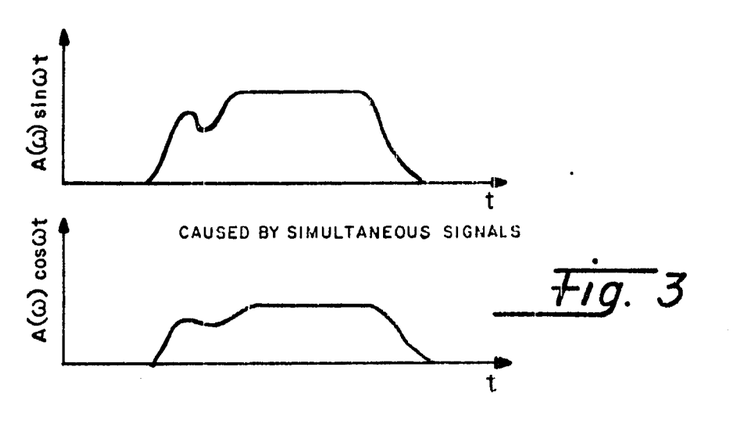
FIG. 3 comprises graphs of the video outputs, showing the transient with a simultaneous signal condition.
Figure 4A:
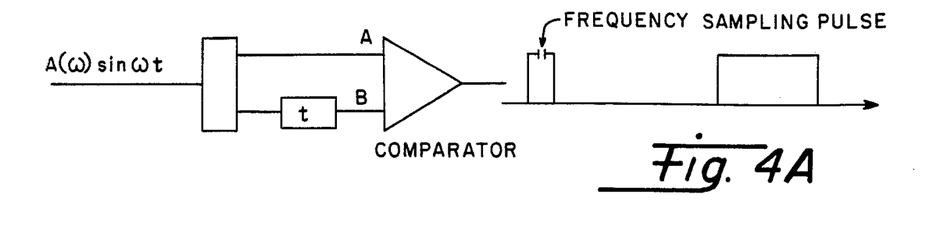
FIG. 4A and 4B are block diagram and graphs shown transient detection with a prior art delay and comparison scheme.
Figure 4B:
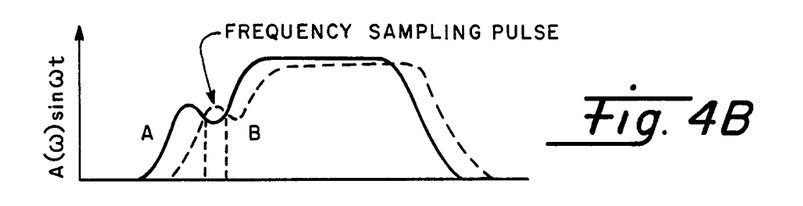
Figure 5A:
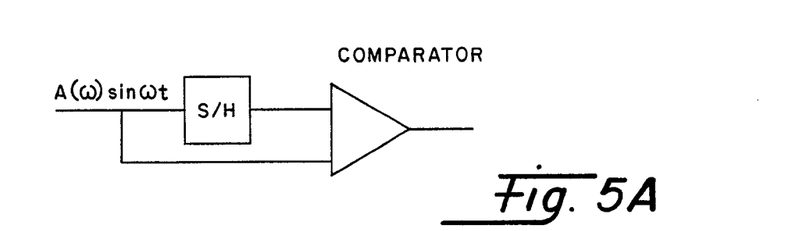
FIGS. 5A and 5B are a block diagram and graph showing transient detection with a prior art sample/hold and comparator circuit.
Figure 5B:
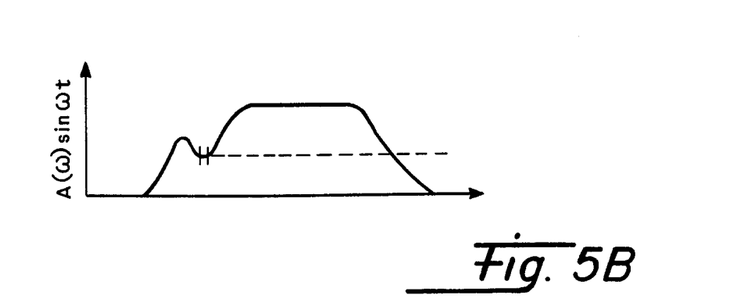

For simultaneous signals with leading edges which are not time coincident, there are at least three methods to detect the existence of the transient condition on the $A(\omega)\sin\omega\tau A(\omega)\cos\omega\tau$ video output lines. The video outputs $A(\omega)\sin\omega\tau/A(\omega)\cos\omega\tau$ of a single signal is shown in FIG. 2. When there are simultaneous sigans, the harmonic frequencies generated in a limiter, which is a commonly used component in the IFM receiver, will take away energy from the video signals to be encoded. There will be a decrease in amplitude of the $A(\omega)\sin\omega\tau/A(\omega)\cos\omega\tau$ video signals as shown in FIG. 3. One method of detecting this transient is to use a differentiator. The major problem associated with this design is the inherent instability of the wideband differentiator circuit required for short transient time detection. Another method is to delay one of the video signals and compare the delayed and nondelayed signals. This is shown in FIG. 4(a). The waveforms associated with points A and B of 4(a) are shown in 4(b), with the delayed signals slightly attenuated. If there is only one signal, there is no output from the comparator at the frequency sampling pulse of the receiver. If there are simultaneous signals, there is output from the comparator at the frequency sampling pulse as shown in FIG. 4(b). Another method to detect the transient is to use a sample and hold (S/H) circuit to sample the amplitude of $A(\omega)\sin\omega\tau/A(\omega)\cos\omega\tau$ at the frequency sampling pulse and compare with the rest of pulse as shown in FIG. 5(a). If the rest of the pulse is higher than the S/H output, there are simultaneous signals as shown in FIG. 5(b). When there is only one signal arriving at the receiver, the output of the receiver will be zero. Both the methods mentioned work to some extent. The main problem with both schemes is the difficulty encountered in adjusting the system. The system should be adjusted to have low false alarm rates and high probability of detection of simultaneous signals. False alarm is defined as the case when there is ony one signal present, the detection circuit will indicate simultaneous signals.

Digital Simultaneous Signal Detection Circuit

The objective of this circuit is to detect the existence of simultaneous signals through the detection of the transient in the $A(\omega)\sin\omega\tau/A(\omega)\cos\omega\tau$ video outputs. The main problem with the corresponding analog approaches as mentioned in the above Section is the difficulty in threshold adjustments. This difficulty is caused by the amplitude of $A(\omega)$ being a function of frequency. To overcome this problem, $A(\omega)$ was measured first and a threshold of $B(\omega)$ which is lower than $A(\omega)$ is set in a read only memory (ROM) as shwon in FIG. 6. The value of $A(\omega)$ is measured through the following steps: First measure $A(\omega)\sin\omega\tau$ and $A(\omega)\cos\omega\tau$ in digital format versus frequency. Then square $A(\omega)\sin\omega\tau$ and $A(\omega)\cos\omega\tau$ and sum them together. Finally take the square root of the result to obtain $A(\omega)$, because $$\sqrt{A^2(\omega)\sin^2\omega\tau + A^2(\omega)\cos^2\omega\tau} = A(\omega)$$

Figure 7:
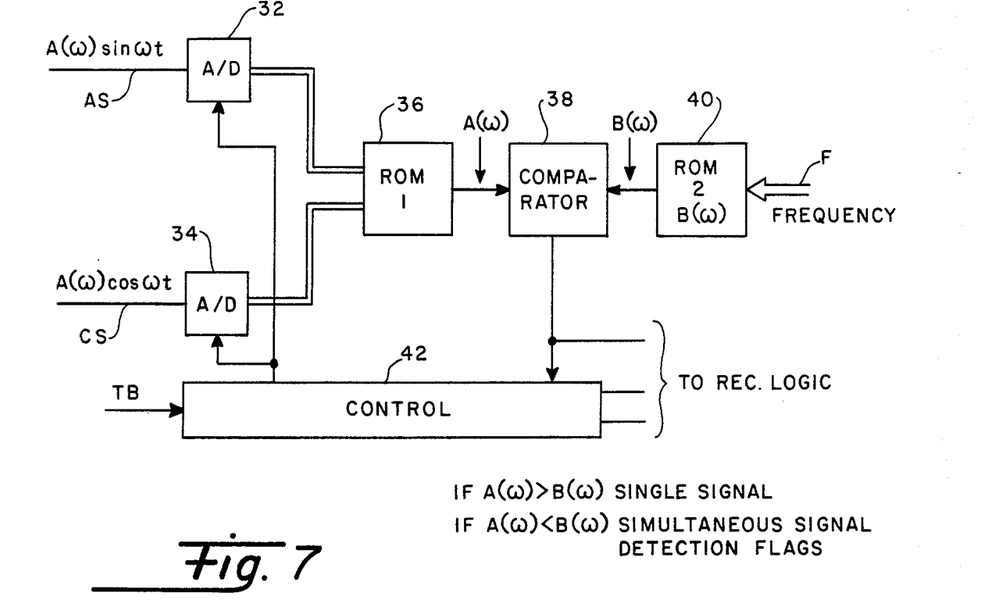
FIG. 7 is a block diagram of a digital simultaneous signal detection circuit according to the invention.

Repeat this measurement on $A(\omega)$ at different power levels to find the minimum value of $A(\omega)$ at each frequency. The threshold $B(\omega)$ is then set one or two levels lower than the value of $A(\omega)$ and these values are stored in ROM. The value of $A(\omega)$ can be collected by a computer in software. Since $A(\omega)$ does not vary rapidly with $\omega$, not all the frequency bits are required. For example, the IFM receiver used in this experiment has 11 bits of frequency; however only 8 bits are required. The value of $A(\omega)$ can be measured with 4 bits in amplitude. To implement this idea in hardware, A/D converters followed by ROM are used to generate $A(\omega)$ as shown in FIG. 7. ROM 1 will perform the squaring, addition and square root to produce $A(\omega)$. ROM 2 is used to store the threshold $B(\omega)$. The value of $A(\omega)$ is compared with $B(\omega)$. If $A(\omega)$ is greater than $B(\omega)$, there should be only one signal. If $A(\omega)$ is less than $B(\omega)$, the simultaneous signal flag will be on.

If a weak signal is followed by a strong one, another measurement on the frequency, immediately following the first one, will obtain the frequency on the second pulse correctly. This circuit has been fabricated and about 80–90% of the simultaneous condition can be obtained. If the value of $A(\omega)$ is drifted with time a different value of threshold $B(\omega)$ can be obtained and stored in a new ROM. For this approach, there is no adjustment required.

Conventional IFM Receiver

Figure 8:
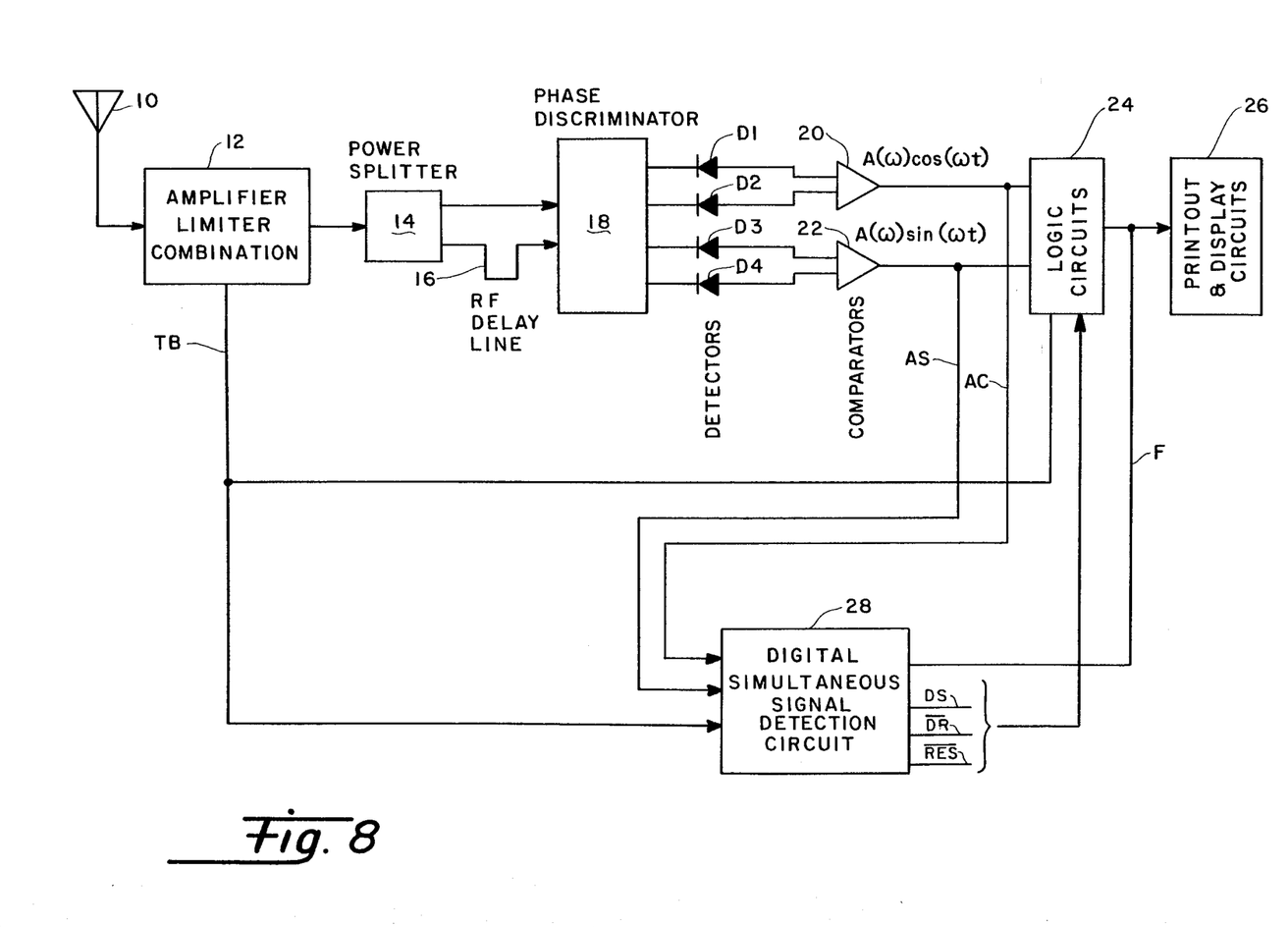
FIG. 8 is a block diagram of a conventional IFM receiver, plus a block for the circuit of FIG. 7 or FIG. 9.

A typical conventional prior art IFM receiver consists of six major parts: RF section, Rf delay line, phase discriminator, diode detectors, comparators, and logic readout and utilization circuits as shown in FIG. 8 across the top. An input signal passing through the RF section is separated into two parts: one proceeds directly to the phase discriminator 18, the other one passes through a delay line 16 before proceeding to the phase discriminator 18. At the outputs of the discriminator there are four diode detectors followed by comparators 20,22 and logic circuits 24.

The RF section of an IFM receiver consists of RF amplifiers and limiters 12. The amplifiers amplify the input signals to higher power levels. The limiters attenuate only the strong signals and pass the weak ones unattenuated. In the ideal case, the amplifier limiter combination will produce an output signal at a fixed power level independent of the input signal level. The amplifier limiter combination also includes a threshold detector, with a logic output signal TB which indicates when a signal is received of sufficient strength to exceed a predetermined value. This signal is used in the logic circuits to initiate a frequency measurement. Following the amplifier-limiter combination, is a power divider 14; which splits the signal into two parts which follow parallel paths.

The RF delay line is in only one of the two parallel signal paths. Its purpose is to slow down the signal it carries and delay its arrival time at the phase discriminator with respect to the other (undelayed) signal. The insertion loss of the delay line should be minimal. It is very important that the delay time be independent of temperature. Otherwise, the frequency reading to the receiver will be temperature dependent, an undesirable condition.

The phase discriminator is a passive microwave circuit which has two inputs and four outputs. It provides proper phase shifts for both input signals, so that at two of the outputs sine terms are available, while at the other two outputs cosine terms are available.

There are four diode detectors, $D_1$, $D_2$, $D_3$, and $D_4$, one connected at each of the four outputs of the phase discriminators. Their functions are twofold; first they convert microwave signals to video signals, and second they perform a mathematical "square" on the microwave signals. At the output of the detectors, all the high frequency terms are filtered out by the use of low pass filters, only the video signal can pass. The four diode outputs implementing the "squaring" function, can be represented by: $1+\cos\omega\tau$, $1-\cos\omega\tau$, $1+\sin\omega\tau$, and $1-\sin\omega\tau$, where $\omega$ is the angular frequency and $\tau$ is the delay time of the delay line.

The comparators perform a mathematical "substract" function. Each comparator has two inputs and one output. The output equals the difference of the two inputs. The outputs from the detectors are connected to the inputs of the comparators. The $1+\cos\omega\tau$ and $1-\cos\omega\tau$ terms are fed into one comparator and its output is 2 $\cos\omega\tau$. The outputs $1+\sin\omega\tau$ and $1-\sin\omega\tau$ terms are fed to the other comparator and its output is 2 $\sin\omega\tau$. By measuring the $\cos\omega\tau$ and $\sin\omega\tau$ terms, the frequency of the output signal can be obtained.

The logic circuits are used to measure the $\sin\omega\tau$ and $\cos\omega\tau$ terms and generate requency information in digital form for display and utilization. Although the logic circuits are very important in an IFM receiver, they are not critical to this invention. Therefore, a detailed discussion of the conventional logic circuits is not presented here.

At the bottom of FIG. 8 there is shown a block for the digital simultaneous signal detection circuit 28 which according to the invention is added to the receiver.

Amplitude v. Frequency

The above description of the conventional IFM refers to the ideal situation in which the output of the amplifier-limiter combination 12 in FIG. 8 has a fixed power level, in which case the outputs of the comparators 20 and 22 are functions only of the cosine and sine functions. In real receivers the power level is a function of both frequency and of input power from the antenna, and the characteristic is different for each receiver. Therefore the outputs of comparators 20 and 22 are shown as functions of $A(\omega)$. The characteristic can also change as the receiver circuits age. This variation of amplitude creates a problem with the prior art analog transient detector circuits.

The digital simultaneous signal detection circuit provides a significant improvement in reliability and probability of detecting the presence of simultaneous signals by detection of the transient condition shown in FIG. 3. The operation is based upon the fact that the transient has a lower amplitude than normally ever occurs when only a single signal is present. This is because the limiter in circuit 12 (FIG. 8) is a non-linear circuit, and when over two or more signals at different frequencies are simultaneously present in a non-linear circuit, a mixing and heterodyne action takes place. Some of the RF energy then appears in the signals at the sum and difference frequencies, reducing the energy present at the original signal frequencies. Filters present in the normal receiver circuits will remove the signals at the out-of-band sum and difference frequencies, thus reducing the total output power level as compared to the single signal condition.

To provide a standard for comparison, the function $A(\omega)$ is determined with a signal generator for single-frequency signals. This can be accomplished by connecting the signal generator in place of the antenna 10 in FIG. 8, and connecting the leads AS and AC to a computer input, via analog-to-digital converters. The signal generator is then operated at a particular level at fixed frequency increments and the amplitude levels are measured and stored for each frequency. Runs are made at different signal levels from the signal generator.

Figure 6:
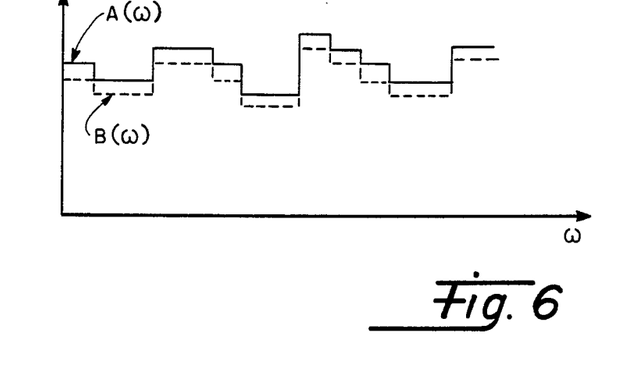
FIG. 6 is a graph showing amplitude versus angular frequency showing how the predetermined values are obtained for the present invention.

The computer can then determine the amplitude $A(\omega)$ for each frequency for each run, using the fact that $A(\omega)$ can be computed by squaring the sine and cosine values, adding the squared values, and then taking the square root. For each frequency, the amplitude values are then compared for all of the runs, and the lowest value is selected. The result is represented in FIG. 6 as a value $A(\omega)$ for each value of the angular frequency $\omega$. This is the lowest value which could be expected to occur when a single signal is received in normal operation. The value of $B(\omega)$ in FIG. 6 at each frequency is defined as being less than this computed minimum value of $A(\omega)$ at the same frequency.

The amplitude is represented in digital form by four bits, and the frequency by eight bits. The frequency increments are then 10 megahertz. The amplitude increments can be determined by defining the highest value of A in FIG. 6 as the decimal value of 15. The maximum value of B is then 14. The values of B are then stored in the second read-only memory 40 (FIG. 7), using the eight bits of frequency as the address. The word at each address has four bits.

The first read only memory 36 also has eight address bits, and words of four bits. The eight address bits are considered as representing two members of four bits each. The word stored at each address is the square root of the sum of the squares of these two numbers. For example, if the address represents the numbers 3 and 4, the output should be 5, so the word stored at address 0011-0100 is 0101. If the input numbers are 2 and 2, the output is 2.828 which is rounded to 3; and thus the word stored at address 0010-0010 is 0011. It will be noted that addresses exist which would produce an output value greater than 15, which would require more than four bits. However, these addresses should not be generated in normal operation, because when the sine term is at a maximum, the cosine term is zero, and vise versa. The value of the output should never exceed the maximum value of either input term. Therefore, if such addresses do occur in operation this indicates an error of some kind has probably occurred, and the flag should be raised. This can be accomplished by storing the value 0000 at such addresses.

Thus whenever the value $A(\omega)$ in the first memory is less than the value $B(\omega)$ stored in the second memory, a transient indicates a simultaneous signal condition, and the flag DS is raised.

Prototype

Figure 9:
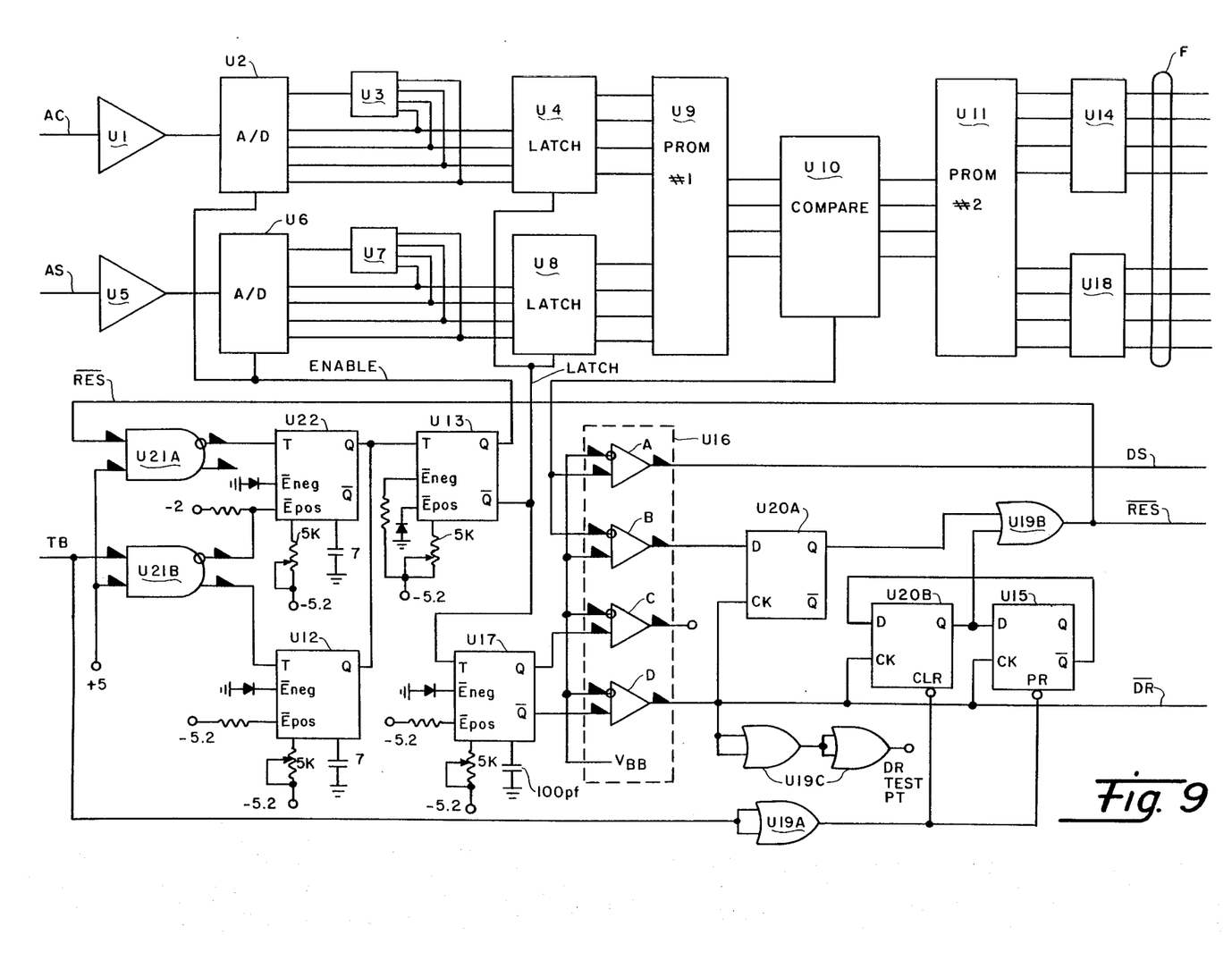
FIG. 9 is a functional block diagram of one embodiment of the diagram of FIG. 7.

FIG. 9 is a functional block diagram of a prototype digital simultaneous signal detection circuit 28 (lower block of FIG. 8).

The cosine and sine signals on leads AC and AS pass through operational amplifiers U1 and U5 to the analog-to-digital converters U2 and U6 respectively. The digital signals on four leads from A/D converter U2 goes to a set of latches U4, and four leads from converter U6 go to latches U8. The eight output leads from the latches U4 and U8 are used to address the first PROM U9. The digital output from PROM U9 to comparator U10 represents the amplitude $A(\omega)$ of the detected radar signal.

In FIG. 8, the receiver output from the logic circuits 24 is the detected frequency encoded as eleven binary digits. The eight most significant bits on cable F (FIG. 9), via logic interface circuits U14 and U18 are used as the address of the second PROM U11. The four output bits to comparator U10 represent the signal condition $B(\omega)$. When $A(\omega)$ is less than $B(\omega)$, the output of comparator U10 goes high, and via a logic interface circuit U16A appears on output lead DS. The signal is also inverted via interface circuit U16B and applied to the D input of a flip-flop U20A.

The threshold broken signal on lead TB from the receiver is processed via four monostable multivibrators or one shot devices U12, U13, U17, U22. These units have a trigger input T and enable inputs "not Eneg" and "not Epos", with the following truth table.

| Epos | Eneq | Output |
|---|---|---|
| L | L | Triggers on both positive and negative input slopes |
| L | H | Triggers on positive input slope |
| H | L | Triggers on negative input slope. |
| H | H | Trigger is disabled. |

The One shots U12 and U17 are biased to trigger on positive input slopes, the one shot U13 is biased to trigger on negative input slopes, and one shot U22 is controlled by the signal TB to be disabled when the signal TB is low and to trigger on a positive input slope when signal TB is high.

The control logic also includes three D type flip-flops U20A, U20B and U15, and a quad OR gate unit U19. The clock inputs of all three flip-flops are connected to a lead "not DR". The Q outputs of flip-flops U20A and U20B are connected to OR gate U19B, which has an output to lead "not RES". The "not Q" output of flip-flop U15 is connected to the D input of flip-flop U20B, to form a one-stage counter. The clear input of flip-flop U20B and preset input of flip-flop U15 are coupled to lead TB via gate U19A, which has its two inputs connected together. The lead "not DR" is also coupled to a test point via two gates U19C, each having its inputs connected together.

Whenever the receiver input signal reaches sufficient strength to break the threshold, the signal on lead TB goes high, and via the interface device U21B, triggers the one-shot device U12. The signal on lead TB in its normally low state, via gate U19A, clears flip-flop U20B and presets the flip-flop U15. At the end of the pulse generated by one shot U12, its output goes low and triggers one shot U13. The high output at Q of one-shot U13 enables the A/D converters U2 and U6. At the end of the pulse generated by one shot U13 its "not Q" output goes high to cause the latches U4 and U8 to store the amplitude data. The end of the pulse from the "not Q" output of one shot U13 also triggers one shot U17.

At the end of the pulse from one shot U17, the positive going edge signifies "data ready" and clocks the flip-flops U20A, U20B, and U15. Flip-flop U20B resets, while flip-flop U15 sets.

Assuming that the output of the comparison unit U10 is high, signifying a transient or simultaneous signal condition, the D input of flip-flop U20A will be low so that the flip-flop resets. Then both inputs of OR gate U19B are low, causing the output on lead "not RES" to be low (signal RES high). The signals on leads DS, "not RES" and "not DR" inform the receiver logic circuits 24 of the simultaneous signal condition.

If the output of comparator U10 had been low, the signal on lead DS would have been low, and the D input of flip-flop U20A would have been high to cause it to set when clocked. Then the signal on lead "not RES" would have been high.

In the special design of FIG. 9, the receiver will measure the frequency again at approximately 200 ns from the first measurement. The transient detection is also performed on the second measurement. This is accomplished by the signal on lead "not RES" going low, which is inverted via interface unit U21A to provide a positive going edge to trigger one shot U22. (The signal TB is still high, which inverted maintains the enable input "no Epos low"). One shot U22 generates a pulse, and its trailing edge triggers one shot U13. Therefore the A/D converters U2 and U6 are again enabled, and at the end of the pulse the lathes U4 and U8 store the data. The operation proceeds as before, except that flip-flop U20B now sets and flip-flop U15 resets. The high output of flip-flop U20B keeps the signal on lead "not RES" high, to prevent a third attempt.

Logic Details

The integrated circuits in FIG. 9 comprise Motorola type MECL 10K series for the latches, PROM's, comparator, and one shot units. The D type flip-flops and OR gates are TTL devices of the 7400 series. The latches U4 and U8 are type MC10175, with the latching enable to pins 6 and 7, and the reset on pin 11 connected via a resistor to the negative bias. The PROM's U9 and U11 are type MC10149. The comparator U10 is type MC10166, with the comparason output on pin 2, high for A greater than B. The enable input at pin 15 is connected via a resistor to negative bias.

The operational amplifiers U1 and U5 are type LH0032CG with the input via a 1K resistor to pin 5, pin 6 via a 1K resistor to ground, pin 1 grounded, a 10 pf capacitor between pins 2 and 3, a 5K potentiometer between pins 3 and 4 with its slider to plus 12 volts at pin 12, a 0.01 pf capacitor from pin 12 to ground, minus 12 volts at pin 10 with a 0.01 pf capacitor to ground, pins 1,7,8,9 grounded, output at pin 11, and an adjustable resistor from input to output.

The A/D converters U2 and U6 are type AD6020KD, with the enable input to pin 6. Pin 15 of the converter U2 is connected via a resistor to minus 2 volts, and to pins 5,7,11,13 of a MC10104 quad two-input AND gate, which has its inputs 2,6,10,12 grounded. The four outputs are connected in parallel with the four outputs of the converter, biased via resistors to minus two volts. A device U7 is similarly connected to converter U6.

The one shot devices are type MC10098. The interface devices U21A and B, U14 and U18 are type MC10124 quad TTL to MECL translators. The interface device U16 is a type MC10125 quad MECL to TTL translator.

The D flip-flops U20A, U20B and U15 are type 74S74. Device U19 is a type 7432 having quadruple 2-input positive OR gates.

Thus, while preferred constructional features of the invention are embodied in the structure illustrated herein, it is to be understood that changes and variations may be made by the skilled in the art without departing from the spirit and scope of our invention.

We claim:

1. In an instantaneous frequency measurement (IFM) receiver which has receiving means including a limiter, which in response to simultaneous signals produces heterodyne signals which absorb energy and therefore reduces the output for signals in a filter band, discriminator and detector circuits to provide sine and cosine signals, and logic circuits for processing the sine and consine signals to provide a frequency output in a digital format as a frequency measurement, the improvement comprising:

transient detection means for digital detection of a simultaneous signal condition, comprising two analog-to-digital converters, first and second memories, and comparison means;

said converters having respective inputs coupled one to the sine line and the other to the cosine line of the receiver, and respective outputs providing the sine and cosine signals in digital form;

the converter outputs being coupled to address inputs of the first memory, which by table look up provides a digital output of the square root of the sum of the squares of the sine and cosine signals, and which used as the amplitude of a detector receiver signal;

the second memory having address inputs coupled to a given number of leads of said frequency output, the second memory having stored therein data for each frequency addressed data representing amplitude values at a lower level than the minimum amplitude at that frequency for a single signal condition;

the outputs of the first and second memories being connected to corresponding inputs of the comparison means, the comparison means having an output on which a comparison output signal is at a first level in response to the output of the first memory being less than the output of the second memory and otherwise being at a second level, the presence of simultaneous signals being flagged when the comparison output signal is at the first level.

2. The apparatus according to claim 1, wherein the first and second memories are read only memories, wherein said transient detection means further includes latch means coupled between the analog-to-digital converters and the first memory, and control means including timing means which is responsive to a threshold broken signal from the receiver to initiate operation so that after a predetermined interval an enable signal is supplied to the analog-to-digital converters, after another short interval a latch signal is supplied to the latch means, and after another interval a data ready signal is generated which indicates that the output of the comparison means may be read, the comparison output signal and the data ready signal being supplied to said logic circuits.

3. The apparatus according to claim 2, wherein the control means includes means responsive to said comparison output signal being at the first level to generate a restart signal which is supplied to the receiver to enable it to make a second measurement of the frequency, the restart signal also being supplied to said timing means to initiate a second cycle of operation with an enable signal to the analog-to-digital converters, a latch signal to the latch means, and a data ready signal.

4. The apparatus according to claim 3, wherein the control means includes bistable device means connected to count the cycles of operation and to prevent a third cycle until after the threshold broken signal returns to normal and later reappears.

5. The apparatus according to claim 1, wherein the transient means includes means responsive to said comparison output signal being at the first level to cause the receiver to measure the frequency again after an interval from the first measurement, and to also perform the transient detection on the second measurement.

* * * * *

UNITED STATES PATENT AND TRADEMARK OFFICE
CERTIFICATE OF CORRECTION

PATENT NO. : 4,547,727

DATED : October 15, 1985

INVENTOR(S) : James B.Y. Tsui et al

It is certified that error appears in the above-identified patent and that said Letters Patent is hereby corrected as shown below:

Col. 4, line 46, "sigans" should read "signals".

Col. 5, line 23, "shwon" should read "shown".

Col. 6, line 59, "requency" should read "frequency".

Col. 10, line 60 (Claim 1), "detector" should read "detected".

Signed and Sealed this

Twenty-fifth Day of February 1986

[SEAL]

Attest:

DONALD J. QUIGG

Attesting Officer

Commissioner of Patents and Trademarks